US008337959B2

(12) United States Patent
Zhang et al.

(10) Patent No.: US 8,337,959 B2
(45) Date of Patent: Dec. 25, 2012

(54) METHOD AND APPARATUS TO APPLY SURFACE RELEASE COATING FOR IMPRINT MOLD

(75) Inventors: Wei Zhang, Plainsboro, NJ (US); Lin Hu, Livingston, NJ (US); Hua Tan, Princeton Junction, NJ (US); He Gao, Plainsboro, NJ (US); Linshu Kong, Plainsboro, NJ (US); Stephen Y. Chou, Princeton, NJ (US)

(73) Assignee: Nanonex Corporation, Monmouth Junction, NJ (US)

( * ) Notice: Subject to any disclaimer, the term of this patent is extended or adjusted under 35 U.S.C. 154(b) by 613 days.

(21) Appl. No.: 11/945,470

(22) Filed: Nov. 27, 2007

(65) Prior Publication Data

US 2008/0131623 A1 Jun. 5, 2008

Related U.S. Application Data

(60) Provisional application No. 60/867,498, filed on Nov. 28, 2006, provisional application No. 60/869,981, filed on Dec. 14, 2006.

(51) Int. Cl.
*H05H 1/24* (2006.01)
*C23C 16/00* (2006.01)
*B05D 3/00* (2006.01)
*B05D 3/02* (2006.01)

(52) U.S. Cl. ...................... 427/569; 427/248.1; 427/299; 427/314

(58) Field of Classification Search .................. 427/569, 427/248.1, 299, 314
See application file for complete search history.

(56) References Cited

U.S. PATENT DOCUMENTS

| 7,294,294 | B1* | 11/2007 | Wago et al. ............... 264/2.5 |
| 2004/0202865 | A1* | 10/2004 | Homola et al. ............ 428/421 |
| 2005/0042553 | A1* | 2/2005 | Lu et al. ................. 430/322 |
| 2006/0222899 | A1* | 10/2006 | Sugimura et al. .......... 428/826 |
| 2007/0166557 | A1* | 7/2007 | Keil et al. ................ 428/457 |

OTHER PUBLICATIONS

Keil et al, Process development and characterization of antisticking layers on nickel-based stamps designed for nanoimprint lithography [J. Vac. Sci. Technol. B 22(6), Nov./Dec. 2004].*
Kao et al. IEEE transactions on Electron Devices, vol. 52 No. 8 Aug. 2005 pp. 1722-1726.*
Jansen et al. J. Micromech. Microeng. 6 (1996) pp. 14-28.*

* cited by examiner

*Primary Examiner* — Kelly M Gambetta
(74) *Attorney, Agent, or Firm* — Polster, Lieder, Woodruff & Lucchesi, LC (57) ABSTRACT

In imprint lithography, the mold is coated with a surface release layer for a non-sticking separation. Bonding strength of the release layer to the mold depends on the cleanness of the surface and the process of release layer deposition. In accordance with the invention, the mold is disposed in an evacuable chamber, cleaned to remove surface organic contamination and coated with the surface release layer in a chamber, all without relocation or undesired time delay. The chamber encloses a support chuck for the mold or substrate, a surface cleaner unit adjacent the support, a heating source adjacent the support, and advantageously, sensors of measuring chamber pressure, vapor partial pressure and moisture concentration. A vapor source connected to the chamber supplies release surfactant vapor. The mold is cleaned, and the cleaning is followed by vapor phase deposition of the surfactant. The mold is advantageously heated. Typical ways of cleaning include exposure to ozone or plasma ion etch. Surfactant vapor may be generated by liquid surface vaporization, liquid injection or spray vaporization. A surface adhesion promoter can be coated on the substrate by a similar method with the same apparatus.

23 Claims, 12 Drawing Sheets

METHOD AND APPARATUS TO APPLY SURFACE RELEASE COATING FOR IMPRINT MOLD

CROSS-REFERENCE TO RELATED APPLICATIONS

The present application claims the benefit of U.S. Provisional Patent Application Ser. No. 60/867,498 filed on Nov. 28, 2006 and U.S. Provisional Patent Application Ser. No. 60/869,981 filed on Dec. 14, 2006, all of which are herein incorporated by reference.

STATEMENT REGARDING FEDERALLY SPONSORED RESEARCH

Not Applicable.

FIELD OF THE INVENTION

This invention relates to treating molds and substrates for imprint lithography, and in particular, to an integrated cleaning/deposition process and related apparatus.

BACKGROUND OF THE INVENTION

Lithography is a key process in the fabrication of semiconductor integrated circuits and many optical, magnetic, biological, and electro-mechanical devices. Lithography creates a pattern on a substrate-supported moldable film so that, in subsequent process steps, the pattern can be replicated in the substrate or in another material that is added onto the substrate.

Conventional lithography, referred to as photolithography, involves applying a thin film of photosensitive resist to a substrate, exposing the resist to a desired pattern of radiation and developing the exposed resist to produce a physical pattern on the substrate. The resolution of patterns produced by photolithography is limited by the wavelength of the exposing radiation. Moreover, as pattern features become smaller, increasingly expensive shorter wavelength equipment is required.

Imprint lithography, based on a fundamentally different principle, offers high resolution, high throughput, low cost and the potential of large area coverage. In imprint lithography, a mold with a pattern of projecting and recessed features is pressed into a moldable surface, typically a thin film, deforming the shape of the film and forming a relief pattern in the film. The film is hardened, as by UV or thermal curing, and the mold and imprinted substrate are separated. After the mold is removed, the thin film can be processed, as by removing the residual reduced thickness portions to expose the underlying substrate for further processing. Imprint lithography can be used to replicate patterns having high resolution features in the microscale and nanoscale ranges. Details of nanoscale imprint lithography ("nanoimprint lithography") are described in U.S. Pat. No. 5,772,905 issued Jun. 30, 1998 and entitled "Nanoimprint Lithography". The '905 patent is incorporated herein by reference.

A significant factor for commercial imprint lithography is the useful life of the imprint mold. The mold lifetime directly affects cost of the products and throughput of the production. The lifetime of the imprint mold is limited by wearing of the mold surface release coating and damage to the mold material. The material damage, such as breaks, surface feature rupture, and surface indentation is caused by the stress and strain of imprinting. Wearing of the surface release coating depends on the surface chemistry, bonding strength and the coverage of the surface release layer. It is also affected by how well the release layer is applied on the mold surface. Reliable methods of applying a surface release layer are much needed for imprint lithography.

BRIEF SUMMARY OF THE INVENTION

In imprint lithography, the mold is coated with a surface release layer for a non-sticking separation. Bonding strength of the release layer to the mold depends on the cleanness of the surface and the process of release layer deposition. In accordance with the invention, the mold is disposed in an evacuable chamber, cleaned to remove surface organic contamination and coated with the surface release layer in a chamber, all without relocation or undesired time delay. The chamber encloses a support chuck for the mold or substrate, a surface cleaner unit adjacent the support, a heating source adjacent the support, and advantageously, sensors for measuring chamber pressure, vapor partial pressure and moisture concentration. A vapor source connected to the chamber supplies release surfactant vapor. The mold is cleaned, and the cleaning is followed by vapor phase deposition of the surfactant. The mold is advantageously heated. Typical ways of cleaning include exposure to ozone or plasma reactive ion etch. Surfactant vapor may be generated by liquid surface vaporization, liquid injection or spray vaporization. A surface adhesion promoter can be coated on the substrate by a similar method with the same apparatus.

BRIEF DESCRIPTION OF THE SEVERAL VIEWS OF THE DRAWINGS

The advantages, nature and various additional features of the invention will appear more fully upon consideration of the illustrative embodiments now to be described in detail in connection with the accompanying drawings.

In the drawings.

It is to be understood that the drawings are to illustrate the concepts of the invention and are not to scale.

DETAILED DESCRIPTION OF THE INVENTION

Figure 1:
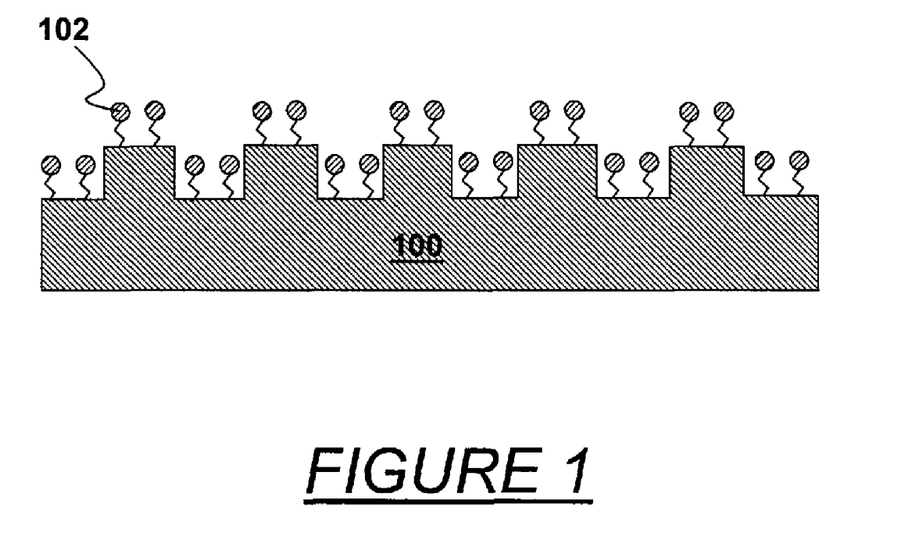
FIG. 1 illustrates surfactant molecular bonding to the mold surface.

Referring to FIG. 1, an imprint mold 100 has its molding surface covered with molecules 102 of an anti-sticking surfactant. Chemical bonds are formed between the molecules and the mold. The coverage of the molecules forms a surface release layer to provide a clean separation of the mold from the imprinted resist after imprinting. The surface release layer may be applied on the mold by any of several ways such as liquid phase immersion, vapor phase deposition, chemical vapor deposition, sputtering, and evaporation. The most widely used ways are liquid phase immersion and vapor phase deposition. Liquid phase immersion requires immersion of the mold in a liquid containing the surfactant. The molecules of the surfactant travel in the liquid and bond to the surface of the immersed mold. In vapor phase deposition, molecules of the surfactant arrive in vapor and bond to the surface of the mold when the vapor contacts with the surface. Compared to liquid phase immersion, vapor phase deposition is better in uniformity and topology coverage. Furthermore, vapor phase deposition consumes less chemical for each treatment and has no chemical waste. Therefore, vapor phase deposition is usually preferred to liquid phase immersion.

Figure 2:
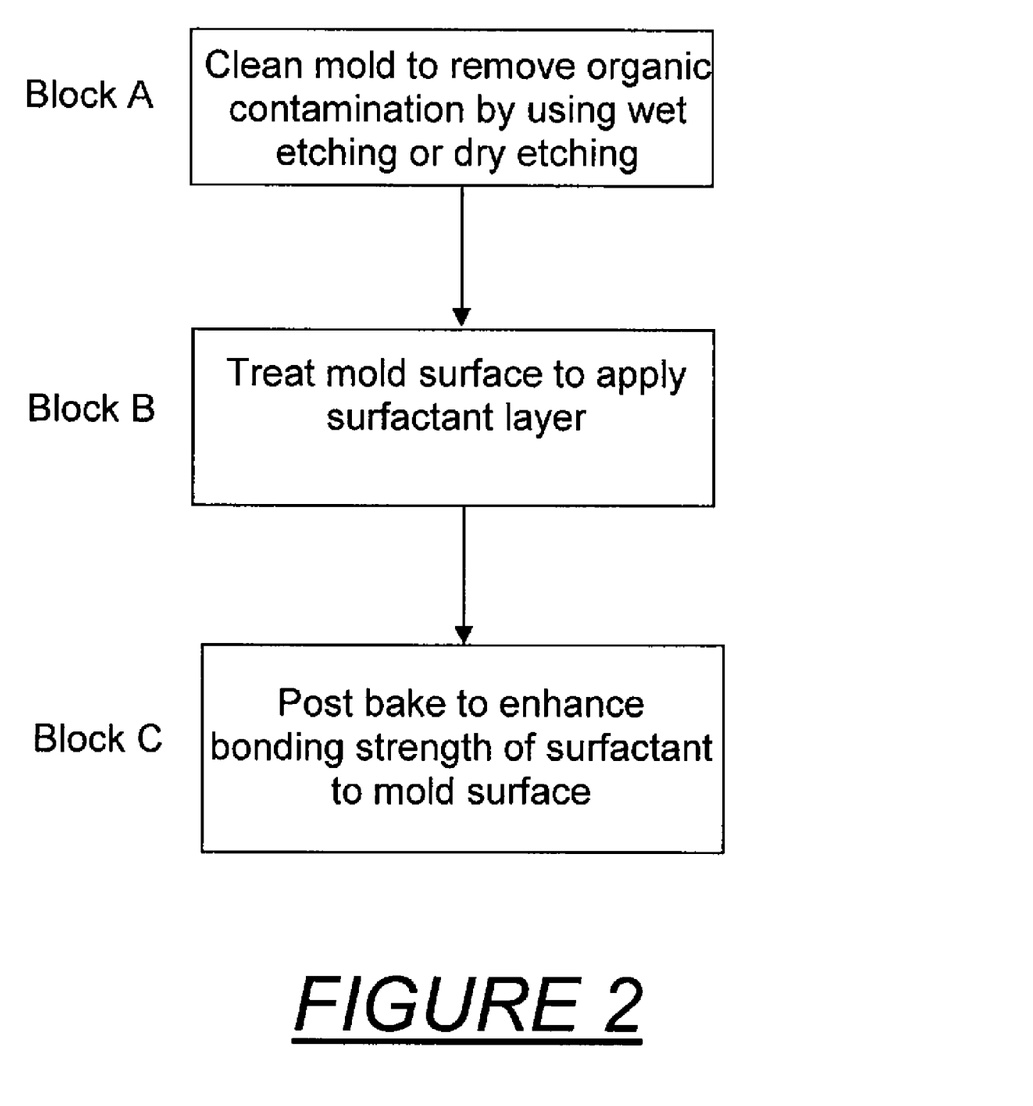
FIG. 2 shows ion coating the mold with a surface release layer.

FIG. 2 illustrates a procedure to apply the surface release layer on imprint mold. The first step, shown in block A, is to clean the mold to remove organic contamination. Surface cleanness is important to achieve good uniformity and high bonding strength of the surface release layer. Advantageously, the cleaning is by wet or dry etching. The next step (Block B) is to apply the surfactant layer to the mold surface. Advantageously, the surfactant is applied by vapor phase deposition. The third step is to bake the mold to enhance the bonding strength of surfactant molecules to mold surface.

The same procedure can be used to apply an adhesion promoter (another surfactant) on the substrate to be imprinted. Thus, the method and apparatus of the invention can treat both the mold and the substrate with the same equipment and are believed effective for applying any type surfactant on a general workpiece.

Figure 3:
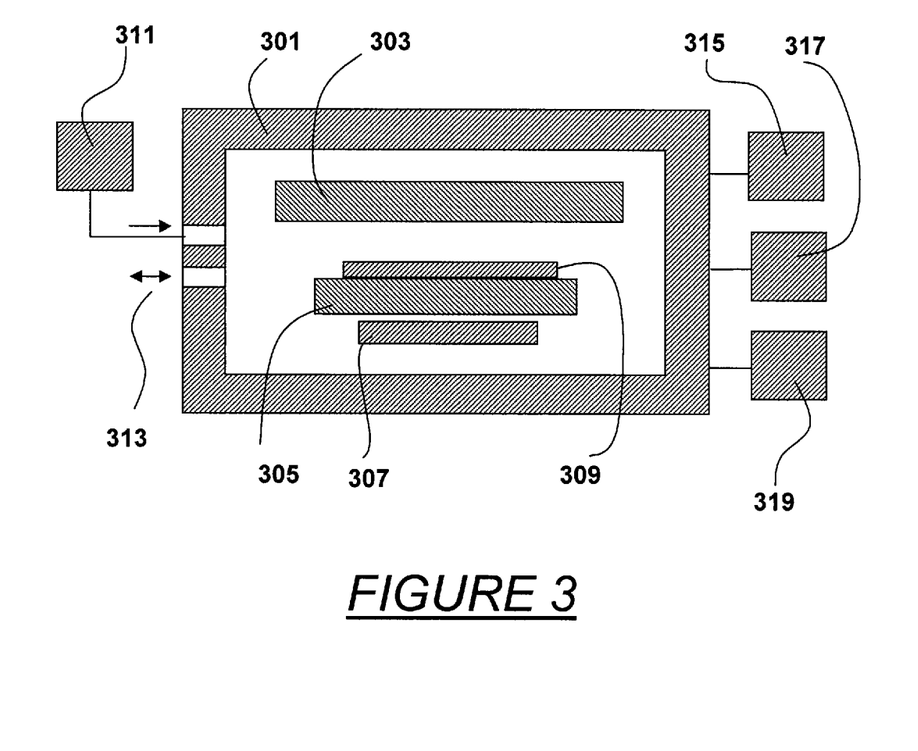
FIG. 3 illustrates apparatus for coating.

FIG. 3 illustrates apparatus for coating the mold. The apparatus has a chamber 301 that is vacuum seal capable. A support chuck 305 inside the chamber supports mold 309 for treatment. Cleaner 303, which can be located above the mold and the chuck, cleans the surface of the mold. A heating source 307, which can be located beneath the chuck, can heat the mold through a thermally conductive chuck. The heating source may be a resistance heater, a lamp heater, or a heated fluid circulator. The wall of chamber 301 is advantageously connected with a vacuum sensor 315 and a surfactant vapor partial pressure sensor 317. A moisture sensor 319 may be connected to the chamber to help control moisture in the chamber. A vapor generation unit 311 is connected to the chamber through a port to provide sufficient flow of vapor surfactant. Pumping or gas feeding 313 can be applied through another port.

In operation, mold 309 is loaded onto the chuck 305 with the molding surface of imprinting features facing upward. Cleaner 303 starts to clean the mold surface. After cleaning, and with minimal delay beyond apparatus response time, vapor deposition starts. The chamber 301 is pumped to a certain level of vacuum. Then vapor of the surfactant is introduced into the chamber from the vapor generation unit 311. The vapor partial pressure in the chamber is measured by the vapor partial pressure sensor 317. A feedback loop may be established to adjust flow-in rate of the vapor in order to control the vapor partial pressure precisely. Since typical surfactant reactions are sensitive to moisture in ambient, the moisture level in the ambient is advantageously monitored by moisture sensor 319. The moisture level may be adjusted by an additional component (not shown) which will be discussed later.

During vapor deposition, the mold may be heated by turning on the heating source 307 to speed up the surface bonding reaction and the coverage of the mold surface by surfactant molecules. After vapor deposition, the chamber is pumped to remove residual vapor. The chuck may be cooled for next run. Finally, the mold can be cooled within the chamber before or after unloading or cooled outside the chamber after unloading.

The apparatus may have a single vapor generation source or multiple vapor generation sources for multiple surfactants. In operation, vapors of surfactants may be introduced one at a time or several at a time. When several vapors are introduced, one should consider in advance acceptable cross contamination of the different surfactants.

Any of several methods may be used to precisely control the moisture level in vapor deposition. One method is to use a source of air with predetermined moisture concentration to purge the chamber. Another is to use a water vapor source to input moisture and a water absorption source to extract moisture. The moisture level in the chamber can be adjusted by controlling alternative operations of the water vapor source and the water absorption source. A third method is to use a water vapor source to input only specific amount of moisture through a flow rate controller.

Figure 4:
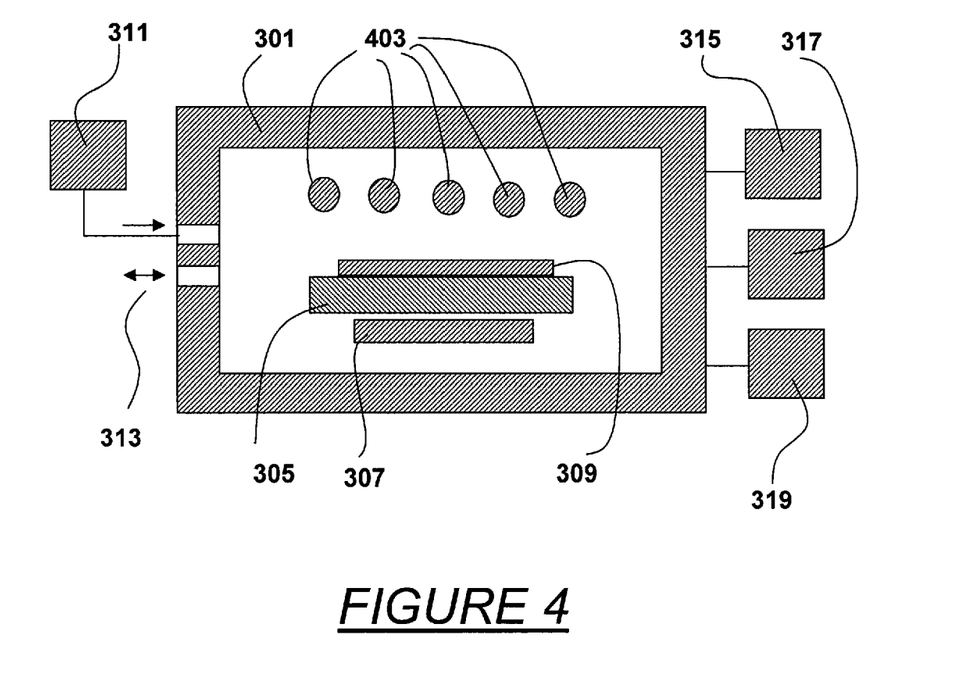
FIGS. 4, 5, and 6 show alternative embodiments of the apparatus.

Referring to FIG. 4, in one embodiment of the apparatus, cleaner 303 may be a ultra-violet (UV) light lamp. UV lamp 403 preferably radiates very short wavelength light (<200 nm) to generate ozone at the mold surface to clean the mold. The lamp advantageously has a grid shape or a multi-tubular shape to provide strong, uniform radiation.

Figure 5:
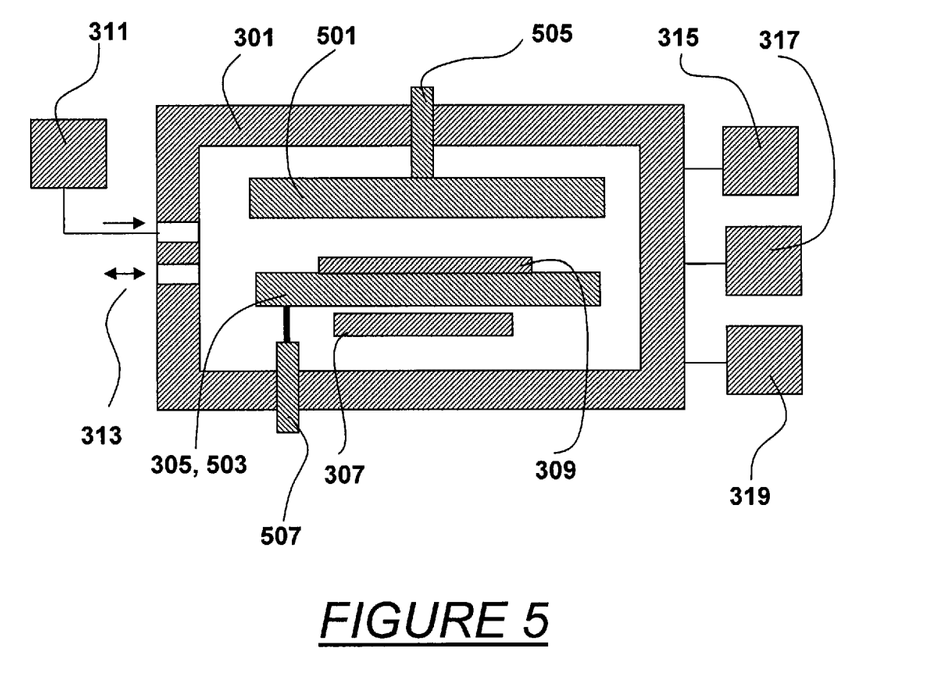

Referring to FIG. 5, in another embodiment of the apparatus, cleaner 303 may comprise plasma generation electrodes. Top electrode 501 can be connected to one end of a plasma power supply through a conductive feedthrough 505. Bottom electrode 503, which can be chuck 305, may be connected to the other end of the plasma power source through a conductive feedthrough 507. When appropriate gases are mixed inside the chamber at appropriate pressure, plasma can be produced close to mold surface and chuck surface. The plasma generates ions of gas radicals that can clean the mold surface from organic contamination. The most common plasma cleaning gas is oxygen. To have uniform plasma cleaning across mold surface, the electrodes should be larger than the mold area.

Figure 6:
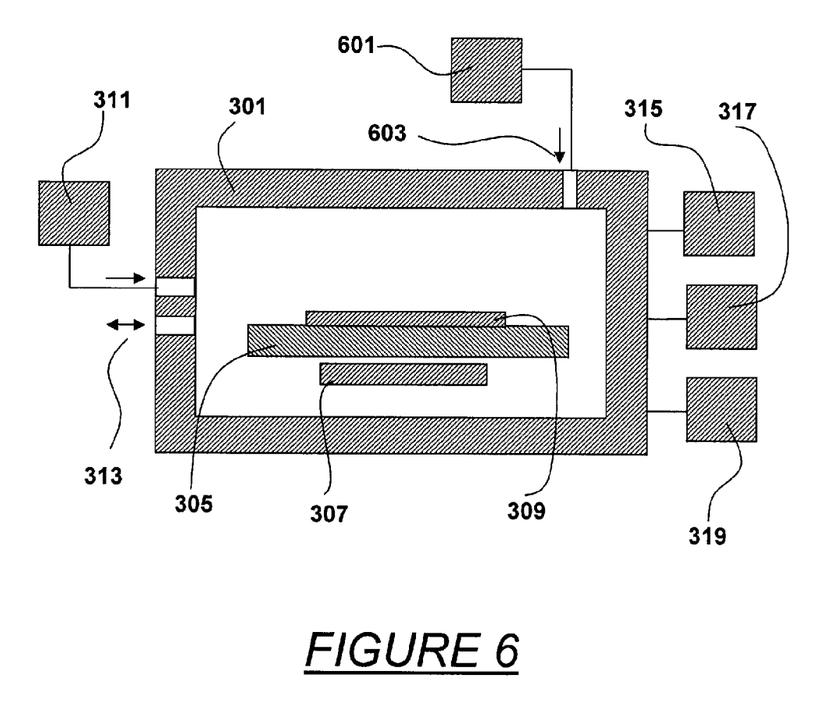

FIG. 6 illustrates another embodiment of the apparatus where cleaner 303 comprises an external reactive gas source 601 connected to the chamber by gas line to a port 603. The reactive gas is introduced into the chamber to react with organics on the mold surface. The gas cleans the mold. There may be flow rate controller (not shown), valve (not shown) or both to control the flow-in amount of reactive gas introduced. As an example, the reactive gas source may be a ozone generator or an ozone storage cylinder. The apparatus of FIG. 6 should connect into a venting or exhaust environment in order to safely evacuate any hazardous gas used or generated.

One embodiment of the vapor generation source can be a gas reservoir that contains a predetermined concentration of surfactant vapor. The gas preferably comprises nitrogen, argon, helium or air. The surfactant vapor can be generated by vaporizing the surfactant and mixing it with the gas at predetermined ratio. The mixture is then filled into the reservoir. Alternatively, a user could install a prefilled reservoir as from a commercial supplier.

Figure 7A:
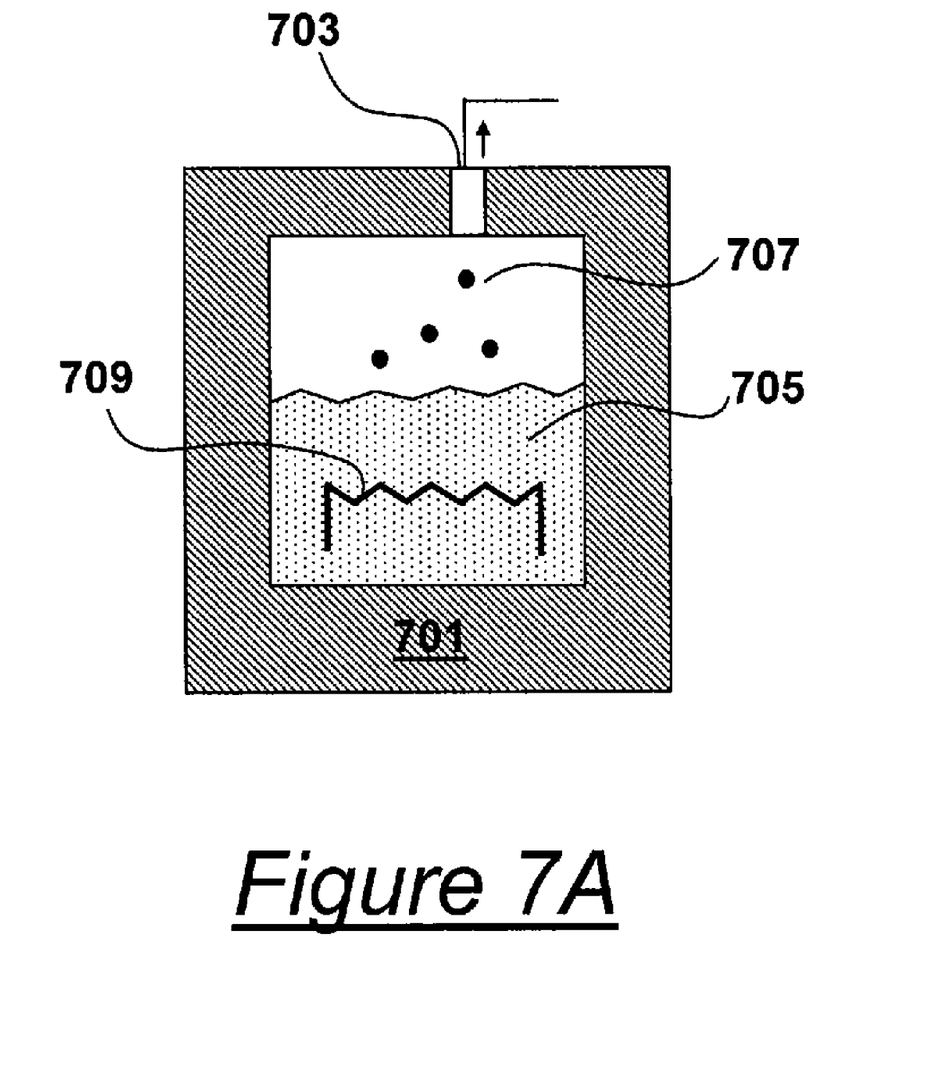
FIGS. 7A, 7B and 8 show embodiments of vapor generation sources.

FIG. 7A illustrates a vapor generation source comprising a container 701 that is sealed and filled with liquid surfactant 705. A port 703 is to evacuate vapor of surfactant 705 out to the cleaner. When the ambient above the liquid 705 is pumped through port 703 into low pressure, surfactant molecules 707 leave the surface of liquid 705 and form vapor above the surface. The molecules can be evacuated through port 703 and be fed through the gas line into the cleaner. To generate a high density of vaporized molecules (high vapor pressure), the liquid 705 can be heated. The higher the temperature of the liquid, the higher the vapor pressure achieved. To heat the liquid, the container can be heated. Heat is then transferred to the liquid by thermal conduction. Alternatively, an immersion heater 709 can be used to directly heat the liquid. To prevent delay of operation, the liquid can be heated prior to start of vapor deposition.

Figure 7B:
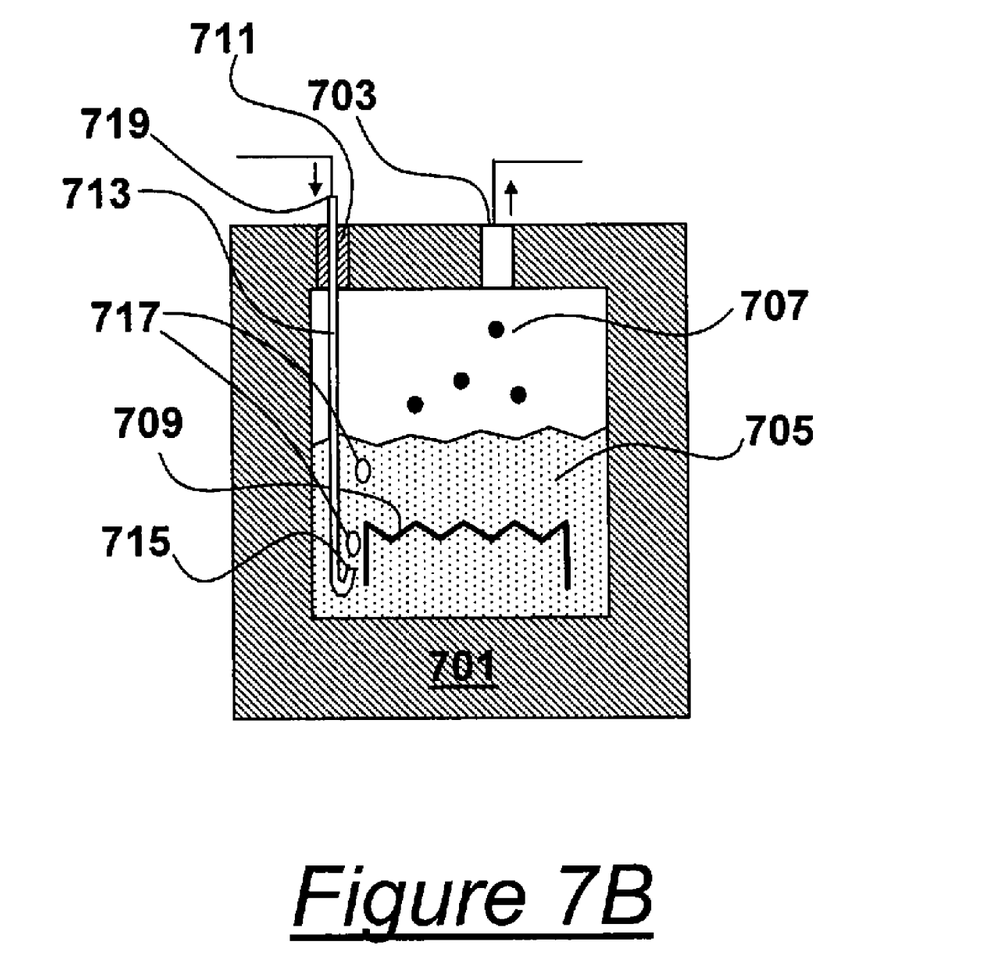

FIG. 7B illustrates an alternative arrangement where a line comprising a bubble-blowing tube 713 is added to the vapor generation source of FIG. 7A. The line may further comprise a valve, flow controller and/or a flow rate sensor. Feedthrough 711 permits tube 713 to pass through the wall of container 701 and keep vacuum seal of the container. Open outlet 715 of tube 713 is emerged within liquid surfactant 705. Inlet 719 of tube 713 is connected to a gas line. The tube 713 material is preferably aluminum, stainless steel, or a teflon-based polymer. During operation, gas can be introduced through the tube into the sealed space inside the container. Bubbles 717 of the gas are generated at outlet 715. When the bubbles rise to the surface of the liquid and break up, they convert surfactant into the vapor state. Therefore, the vapor density of the surfactant molecules 707 will increase. The increased vapor density provides higher quality and faster treatment for very small features on a mold or a mask. An inert gas such as nitrogen, argon, or helium is preferred for its chemical stability. The flow of gas into the container can be either continuous or pulsed. Average flow rate should be controlled to generate sufficient bubbles while retaining a sufficient vacuum or pressure within the container.

Figure 8:
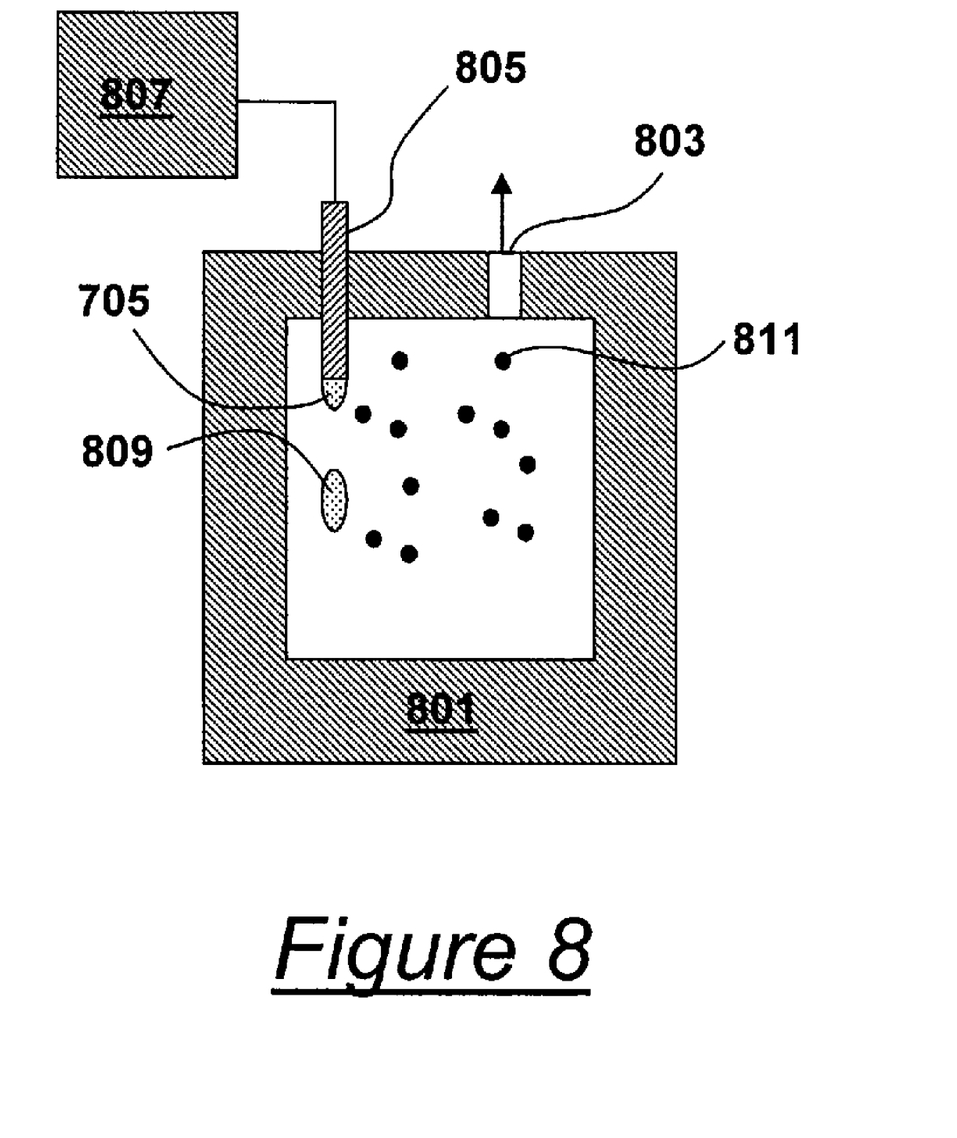

FIG. 8 shows another embodiment of a vapor generation source. Container 801 is sealed. An injector 805 through the container wall is connected to a surfactant reservoir 807. The other end of the injector enters the sealed container 801. The injector 805 can inject a controlled amount of surfactant liquid 705 into the sealed space of the container 801. The liquid may be preheated before going into the injector, heated during passage through the injector, or heated both ways. After going into the container 801, the injected liquid becomes droplets 809. The droplets quickly vaporize due to their small size. The smaller the droplet, the faster vaporization is. The sealed space inside the container 801 may be pumped into vacuum (pumping source not shown). The low pressure of vacuum will dramatically increase the speed of vaporization. Furthermore, the container 801 may be heated to facilitate vaporization (heater not shown). Surfactant molecules 811 can be evacuated through a port 803. Ideally, the amount of injected liquid is controlled to produce complete vaporization inside container and to provide sufficient vapor for a single run. The injection of liquid can be also coordinated with control of vapor deposition in order to have a precise surface release layer coated.

In addition to the port connected to the vapor generation source, the coating apparatus may have a port in chamber 301 connected to a water vapor source. Water vapor can be introduced from the source through the connection line and the port into the chamber. By selecting the amount or flow rate of water vapor introduced into the chamber, the moisture density inside the chamber can be optimally controlled for good coating strength and uniformity. Furthermore, the quality of the mold surface coating treatment can be steadily maintained by controlling the moisture density. In one embodiment, the water vapor source can be a gas reservoir that contains a predetermined moisture concentration. The gas can be air or an inert gas such as nitrogen, argon, or helium. Other embodiments of the water vapor source can be similar to the embodiments described and illustrated in FIGS. 7A, 7B and 8, where surfactant liquid 705 is replaced with pure water.

The principle of the invention can be implemented on a nanoimprint tool to clean the mold and treat it with a surface release coating on the nanoimprint tool. For such case, the described embodiments in the invention will be part of the nanoimprint tool. Through such integration, cleaning and treating the mold on site can minimally interrupt imprinting throughput by saving mold exchange time. In addition, cleaning and treating the mold can be done during the imprinting process in order to achieve higher yield and longer mold lifetime.

Figure 9:
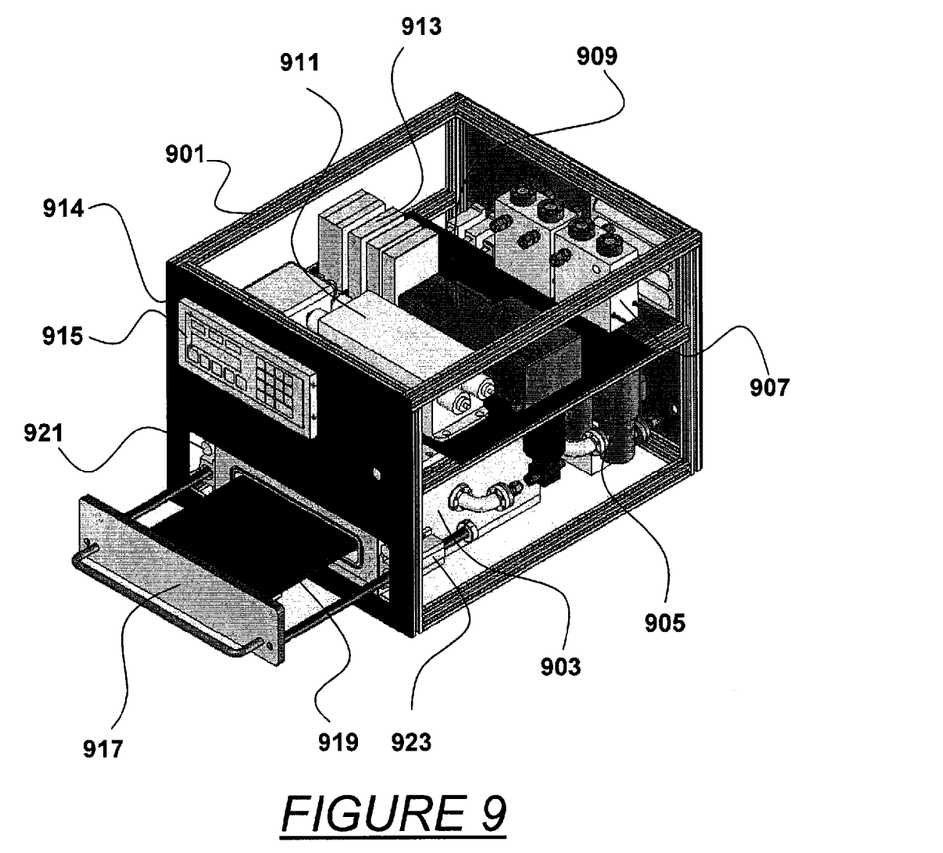
FIGS. 9, 10, and 11 illustrate alternative embodiments of the apparatus.

FIG. 9 illustrates an embodiment of the coating apparatus comprising a frame 901 to accommodate all components. A chamber 903 in which the cleaning and the deposition steps are performed is located in the lower half of the frame. Valves 905 are positioned behind the chamber in the same level. Tubes connect these valves to ports at the rear of the chamber. Additional ports are provided in the chamber for sensors and electrical feedthroughs, partially shown. A vapor generation unit 807 is located at the upper space within the frame on top of the valves. Gas lines (not drawn) connect the vapor generation unit to other components. A programmable-logic-ladder (PLC) control unit 909 is positioned on the upper half space in the frame. The PLC unit runs control software. A high voltage power supply 911 for an Ultra-violet lamp is positioned next to the PLC unit. On the other side of the PLC unit, are control electronics 913, comprising solid state relays and an additional low voltage supply. A display 915 is fixed on front panel 914. The display shows messages of control software and has input keys to input numbers, buttons for process control, and indicators to indicate status. Chamber 903 has a door 917 in the front. The door is connected to a motion support such as bearing 923. The door is also connected to a chuck 919 for supporting the substrate to be processed.

Figure 10:
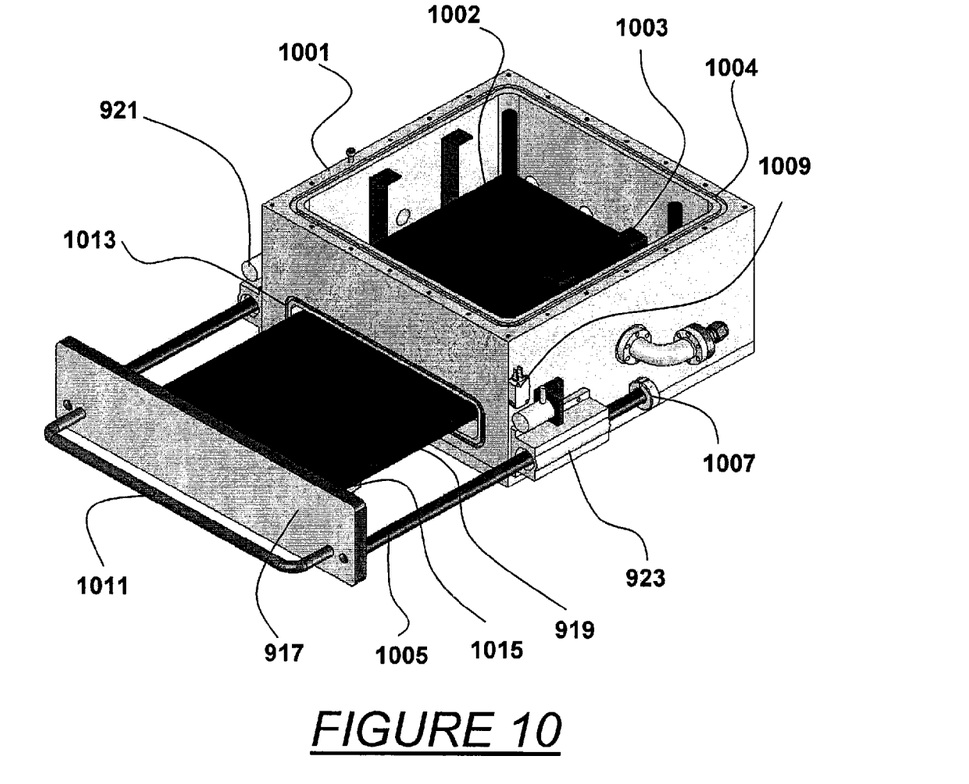

FIG. 10 shows the apparatus with the top plate of the chamber removed. Inside chamber wall 1001, an Ultra-violet (UV) lamp 1003 is above the push-in position of support chuck 919. The UV lamp has grid-shape to cover most of the chuck area. The UV lamp is connected to the top plate (not shown) of the chamber through fixtures 1003. The UV lamp is electrically connected to high-voltage power supply 911 by a feedthrough (not shown) on the chamber wall. There is a vacuum groove and O-ring 1004 on the top surface and along the perimeter of the chamber wall for good seal. Door 917 has a handle 1011. At both sides, the door 917 is connected to rods 1005. The rods pass through bearings 923 and are movable. At the end of rods 1005, there are stoppers 1007 to limit the moving range of the rods. The bearings are side-mounted to outer surfaces of the chamber wall. Door locks 921 are also mounted to outer surface of the chamber wall. A contact sensor 1009 is installed in the same way to indicate whether the door is closed. At front outer surface of the chamber wall, along the perimeter of opening for the chuck, there is vacuum groove and O-ring 1013 for sealing the closed door and the respective chamber wall surface. Chuck 919 is connected to the door through a thermal isolation plate and fixture a 1015. The chuck has cartridge heaters embedded into its body. The heaters are electrically connected to control electronics 913 through a feedthrough (not shown) on the chamber wall. Thermocouple sensors are also mounted to measure temperatures.

Figure 11:
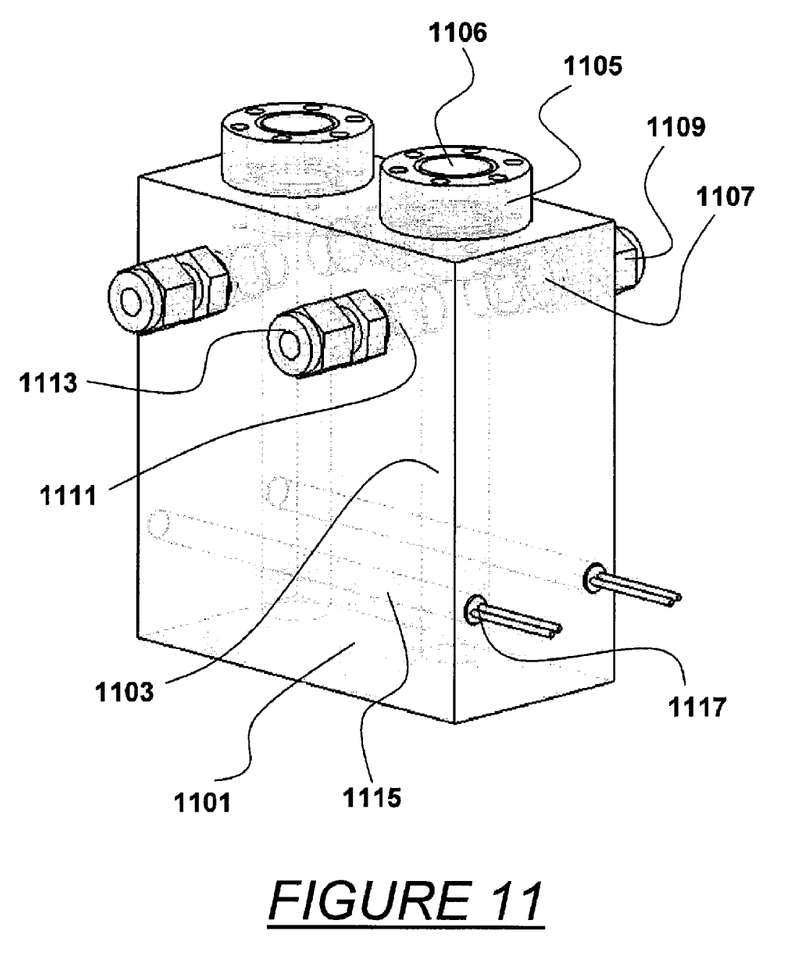

FIG. 11 shows a vapor generation source comprising a body 1101. A cylindrical void 1103 inside the body 1101 serves as volume to store chemical liquid and vapor. The void 1103 is opened on top of the body. A sealing cap plate 1105 with view-through window 1106 is put on upper surface of the void. Near the top opening of the void, port 1109 and port 1111 pass through the body to connect to the void. There are gas/vacuum line fittings 1109 and 1113 installed on the ports respectively. Port 1109 is connected to the chamber to deliver chemical vapor and port 1113 is connected to a nitrogen supply (or vice versa). Cartridge heaters 1117 are inserted into heater tunnels 1115 machined in the body. Heat is transferred to chemicals stored in the void through the body. The body may be made from chemical-resistant material, preferably stainless steel or Teflon, or, inner surface of the void may be coated with chemical-resistant material, such as Teflon. To add chemicals, nitrogen vent is first introduced to the void to protect the chemicals from ambient. Then a cap is removed for dropping in chemicals and put back after the dropping. Finally, the nitrogen is shut off for normal operation. Multiple sets of the same as void 1103, cap 1105, ports 1107/1111 and fitting 1109/1113 may exist in same body 1101. Each set can handle one chemical without cross-interference. The drawing of FIG. 11 illustrates two identical chemical handling sets in the same body. The drawing of FIG. 9 illustrates two identical units of FIG. 11 are installed as chemical generation sources. The apparatus can handle four different chemicals in one tool.

In operation of the apparatus, a substrate, for example a mold or wafer for imprint lithography, is loaded on to the chuck when the door is pulled out. After that, the door is pushed back against front surface of chamber wall. Then, a magnetic solenoid door lock 921 is electrically turned on to hold the door in position. After choosing and installing a program to run process, a user can press a button on the display to run the process. After the process is complete, the door is unlocked and pulled out to unload the substrate. The door shown in FIGS. 9 and 10 is manually opened and closed. It is clear that a driver source, such as motor actuator or pneumatic actuator can be installed to automatically open and close the door.

A detailed example of the operation can now be described step by step. The first step is to load mold or substrate. The second step is to turn on UV lamp to generate Ozone to clean mold or substrate. The cleaning step may take from tens seconds to several minutes. During the cleaning step, the mold or substrate may be heated to facilitate cleaning reaction. The third step is to turn off UV lamp and exhaust the chamber for several minutes to remove residual Ozone. The fourth step is to pump the chamber. Normally, a vacuum better than 1000 mTorr is needed for vapor coating. The vacuum can be reached in 30 seconds. The purging step typically lasts 1-3 minutes to achieve a better vacuum. The base vacuum of less than 50 mTorr can be achieved after 10-15 minutes pumping. During steps 3 and 4, the mold or substrate is heated to vapor coating temperature, which is typical 60-100° C. Surfactant contained inside the vapor generation source is heated to vapor generation temperature. Higher temperatures provide higher vapor density of surfactant. The vapor generation temperature is typically set at 80° C. The fifth step is to coat mold or substrate with surfactant vapor. The temperature that is reached in the previous step is maintained during the coating step. The coating starts with turning on control valve of vapor line. The vapor of surfactant is introduced into the chamber. The coating process on mold or substrate surface begins immediately. Coating typically takes several minutes to twenty minutes. An experimental study of 5 minutes coating deposition time showed that good surface release coating was obtained on a quartz mold. The vacuum pumping may be turned off to rely on good chamber seal to maintain vacuum. In such case, surfactant vapor pressure inside chamber is higher than maintaining vacuum pumping. The sixth step is to close vapor line to stop flow-in of surfactant vapor and pump residual vapor out of the chamber. The pumping may take several minutes to remove most of residual vapor. The seventh step is to vent the chamber. After the chamber is vented to atmosphere, the coated mold or substrate is unloaded. The process was performed on various mold/substrate materials, such as quartz, glass, silicon, III-IV semiconductors, and polymers. Surfactants that were tested include surface release surfactant (1H,1H,2H,2H-perfluorodecyltrichlorosilane) for mold treatment and surface adhesion promoter ((3-Acryloxypropyl)-trichlorosilane) for substrate treatment.

Examples of surfactants which can be used in the apparatus comprise perfluorohexyl-trichlorosilane, perfluorooctyl-trichlorosilane, perfluorodecyl-trichlorosilane, perfluorodecyl-trichlorosilane, perfluorohexylpropyl-trichlorosilane, perfluorodecyl-trichlorotitanium, perfluorodecyl-dichlorobromosilane, polydimethylsiloxane-trichlorosilane, perfluorodecyl-dichlorobromogermanium, perfluorodecyl-dichlorobromomochromium, acryloxypropyl-trichlorosilane, and the like. The apparatus works for any type of surfactant, especially for surfactant having liquid phase at room temperature and higher vapor pressure at a reasonable elevated temperature.

It is to be understood that the above-described embodiments are illustrative of only a few of the many possible specific embodiments which can represent applications of the invention. Numerous and varied other arrangements can be made by those skilled in the art without departing from the spirit and scope of the invention.

The invention claimed is:

1. A method of treating a workpiece comprising either a substrate or a mold for imprint lithography, comprising the steps of:
   providing the workpiece having a surface intended for use in imprint lithography;
   providing a chamber;
   first, placing the workpiece within the chamber;
   second, cleaning said surface of said workpiece using a chemical reaction inside said chamber to remove contamination from said surface without significantly altering said surface; and
   third, without removing said cleaned workpiece to outside said chamber, sequentially depositing a layer of surfactant molecules on said surface, through vapor phase deposition inside said chamber.

2. The method of claim 1 wherein said workpiece is heated by baking within said chamber following deposition of said layer of surfactant molecules to enhance a bonding strength of said surfactant molecules to said surface.

3. The method of claim 1 wherein said surface is illuminated with ultraviolet light within said chamber, and wherein said chemical reaction comprises a reaction with ozone primarily generated by said ultraviolet light at said illuminated surface.

4. The method of claim 1 wherein said chemical reaction comprises reaction with plasma-produced radicals.

5. The method of claim 1 wherein said deposition comprises breaking of molecular chains of said surfactant molecules and connecting ends of said broken chains to the surface.

6. The method of claim 1 wherein said layer is an anti-sticking layer for imprint lithography; and
   wherein said workpiece is a mold for imprint lithography.

7. The method of claim 1 wherein said layer is an adhesion promoter facilitating an adherence of material onto said workpiece; and
   wherein said workpiece is a substrate for imprint lithography.

8. The method of claim 1 further including the step of establishing a desired vacuum within said chamber immediately following said cleaning step and immediately before said depositing step.

9. The method of claim 1 further including the step of activating a heater associated with said chuck during said step of cleaning, and wherein said chuck conducts thermal energy from said heater to said workpiece to heat said workpiece within said chamber during said step of cleaning.

10. The method of claim 1 further including the step of controlling an environment within said chamber between said cleaning step and said deposition step to avoid contamination of said workpiece surface.

11. The method of claim 1 wherein said chamber is a vacuum chamber.

12. The method of claim 1 further including the step of controlling a moisture level within said chamber during said deposition step.

13. The method of claim 1 further including the step of monitoring, with a moisture sensor, a moisture level within said chamber prior to said deposition step.

14. The method of claim 13 further including the step of controlling a moisture level within said chamber for said deposition step by purging said chamber with a source of air having a predetermined moisture concentration.

15. The method of claim 13 further including the step of controlling a moisture level within said chamber for said deposition step by inputting moisture into said chamber from a water vapor source.

16. The method of claim 15 wherein said moisture is input in specific quantity through a flow rate controller.

17. The method of claim 13 further including the step of controlling a moisture level within said chamber for said deposition step by extracting moisture from said chamber with a water absorption means.

18. The method of claim 13 further including the step of controlling a moisture level within said chamber for said deposition step by selectively controlling a water vapor source and a water absorption means in fluid communication with said chamber.

19. A method of treating a workpiece comprising either a substrate or a mold for imprint lithography, comprising the steps of:
   providing the workpiece having a surface intended for use in imprint lithography;
   providing a chamber;
   first, placing the workpiece within the chamber;
   second, cleaning said surface of said workpiece using a chemical reaction inside said chamber;
   third, without removing said workpiece from said chamber, sequentially depositing a layer of surfactant molecules on said surface, through vapor phase deposition inside said chamber; and
   wherein said workpiece is heated within said chamber before said step of cleaning.

20. The method of claim 19 wherein said surfactant molecules for deposition on said surface are generated by a single vapor generation source in fluid communication with said chamber.

21. The method of claim 19 wherein said surfactant molecules for deposition on said surface include a plurality of surfactants, generated by a plurality of vapor generation sources in fluid communication with said chamber.

22. The method of claim 19 wherein said surfactant molecules consist of at least one type of surfactant from a set of surfactants including perfluorohexyl-trichlorosilane, perfluorooctyl-trichlorosilane, perfluorodecyl-trichlorosilane, perfluorodecyl-trichlorosilane, perfluorohexylpropyl-trichlorosilane, perflurordecyl-trichlorotitanium, perfluorodecyl-dichlorobromosilane, polydimethylsiloxane-trichlorosilane, perfluorodecyl-dichlorobromogermanium, perfluorodecyl-dichlorobromomochromium, acryloxypropyl-trichlorosilane, and the like.

23. The method of claim 19 wherein said surfactant has a liquid phase at room temperature and a higher vapor pressure at an elevated temperature during said deposition phase.

* * * * *